United States Patent
Ameen et al.

Patent Number: 5,190,595
Date of Patent: Mar. 2, 1993

[54] OZONE SAFE STRIPPING SOLUTION FOR THERMAL GREASE

[75] Inventors: Joseph G. Ameen, Apalachin; Joseph Funari, Vestal, both of N.Y.; Joseph D. Poole, Charlotte, N.C., David W. Sissenstein, Jr., Endwell, N.Y.

[73] Assignee: International Business Machines Corporation, Armonk, N.Y.

[21] Appl. No.: 753,471

[22] Filed: Sep. 3, 1991

[51] Int. Cl.$^5$ .......................... B08B 3/12; C11D 7/50
[52] U.S. Cl. ........................................ 134/40; 134/1; 134/26; 134/28; 134/38; 252/143; 252/170
[58] Field of Search ...................... 134/38, 40, 26, 28, 134/2, 1; 252/143, 142, 170

[56] References Cited

U.S. PATENT DOCUMENTS

| | | | |
|---|---|---|---|
| 2,753,939 | 7/1956 | Carpenter et al. | 166/303 |
| 3,354,093 | 11/1967 | Early et al. | 252/170 |
| 3,592,691 | 7/1968 | Stelter | 134/42 |
| 3,661,641 | 5/1972 | Vigh et al. | 252/170 |
| 3,789,118 | 1/1974 | Broerman | 424/45 |
| 3,997,360 | 12/1976 | Testa et al. | 134/38 X |
| 4,265,775 | 5/1981 | Aakalu et al. | 252/573 |
| 4,514,232 | 4/1985 | Ameen et al. | 134/1 |
| 4,619,711 | 10/1986 | Olbrueck et al. | 134/38 |
| 4,765,844 | 8/1988 | Merrem et al. | 134/38 |
| 4,973,420 | 11/1990 | Van de Mark | 134/38 X |

*Primary Examiner*—Theodore Morris
*Assistant Examiner*—Saeed T. Chaudhry
*Attorney, Agent, or Firm*—Richard M. Goldman

[57] ABSTRACT

An ozone safe method for stripping a silicone oil base grease from a part. The method includes the steps of providing a stripping composition of an alkylbenzene, a solution comprising a major portion of a propylene oxide derived glycol ether, and glacial acetic acid. The part to be stripped is immersed in the composition while ultrasonically agitating the composition.

8 Claims, 1 Drawing Sheet

OZONE SAFE STRIPPING SOLUTION FOR THERMAL GREASE

FIELD OF THE INVENTION

The invention relates to an ozone safe method for stripping a silicone oil base grease from a part. The method uses organic and aqueous agents that are substantially free of halogens. The method includes the steps of providing a stripping composition of an alkylbenzene, a solution comprising a major portion of a propylene oxide derived glycol ether, and glacial acetic acid. The part to be stripped is immersed in the composition while ultrasonically agitating the composition.

BACKGROUND OF THE INVENTION

The general structures and manufacturing processes for electronic packages are described in, for example, Donald P. Seraphim, Ronald Lasky, and Che-Yo Li, *Principles of Electronic Packaging,* McGraw-Hill Book Company, New York, N.Y., (1988), and Rao R. Tummala and Eugene J. Rymaszewski, *Microelectronic Packaging Handbook,* Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are further interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, circuit boards, and combinations thereof, are used to protect, house, cool, and interconnect circuit components and circuits.

Within a single integrated circuit, circuit component to circuit component and circuit to circuit interconnection, heat dissipation, and mechanical protection are provided by an integrated circuit chip. This chip is referred to as the "zeroth" level of packaging, while the chip enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

In joining the "zeroth" level package, i.e., the integrated circuit chip, to the first level package, i.e., the integrated circuit module, the integrated circuit chip is mounted on a ceramic substrate to form the first level package, i.e., the module. A cap is secured to the top surface of the ceramic substrate, with a suitable hermetic seal to protect the integrated circuit chip. The integrated circuit chip has solder connections to the circuitry on the ceramic substrate, while the completed first level package has conventional pins which make circuit connections to the second level package, i.e., the card.

The integrated circuit chip has $I^2R$ losses, which are manifested by heating and by thermal radiation. In order to reduce the heating of the chip, and allow for radiant and convective heat transfer from the module containing the chip, it is necessary to provide for efficient heat transfer from the integrated circuit chip to the module, and especially to the cap. A thermally conductive grease, also called simply "thermal grease" is provided between the and in contact with both the integrated circuit chip and the cap. The thermal grease has a high coefficient of thermal conductivity and enhances the cooling of the integrated circuit chip during operation. A circuit module of this type is described by R. D. Durand and E. B. Hultmark in CERAMIC CAP AND HEAT SINK FOR SEMICONDUCTOR DEVICE, IBM TECHNICAL DISCLOSURE BULLETIN, Vol. 21 (No. 3), pp. 1064–1065 (August 1978).

Durand and Hultmark describe a module having a substrate with the integrated circuit chip mounted on the top surface, for example by "flip chip" bonding. The module also includes a cap secured to the substrate with a hermetic seal. Thermal grease is provided between the integrated circuit chip and the cap. The thermal grease enhances the thermal conductivity between the integrated circuit chip and the heat sinking cap.

Thermal greases are thixotropic suspensions of a thermal conductor, such as a metal oxide, or a suitably conductive ceramic, as boron nitride, with a thixotrope, in a liquid polymer. Typical liquid polymers have included mineral oils and and are now silicone oils, as described more fully hereinbelow. Typical silicone liquid polymers are dimethylene siloxane and diphenylene siloxane. Typical thixotropes are are silicas, fumed silicas, clays, soaps, and the like. The thermal grease composition has a pasty consistency and acts like a thermal bellows. The thixotropic nature of the thermal grease allows the thermal path between the integrated circuit chip and the module cap to be maintained notwithstanding thermal expansion and contraction, and differential rates thereof as between the integrated circuit chip, the substrate, and the cap. Loss of thermal grease continuity between the integrated circuit chip and the cap, whether due to gaps or to changes in the thermal properties of the thermal grease, can lead to overheating of the chip.

In manufacturing a module as described above, the thermal grease is dispensed from a suitable source into the cap and onto the integrated circuit chip, such that good thermal contact is provided between the integrated circuit chip and the cap. The module is then assembled and tested. Testing indicates whether or not the grease is properly positioned and properly fills the module. Early thermal grease compositions could not be removed, and the cap had to be discarded if the thermal and/or electrical testing was unsatisfactory.

Subsequently, a removable thermal grease was introduced. This grease was a boron nitride - mineral oil composition. While removable, the boron nitride- mineral oil grease suffered from shortcomings. First, chlorinated organic solvents and polar organic solvents where required to remove the boron nitride - mineral oil grease. Second, the boron nitride - mineral oil thermal grease was subject to chemical degradation if the module was not completely hermetically sealed, and the resulting corrosion products then attacked the contact leads between the integrated circuit chip and the substrate. Finally, the boron nitride mineral oil thermal grease had a tendency to phase separate.

A replacement for boron nitride - mineral oil thermal grease is a silicone oil thermal grease. This type of thermal grease is described in U.S. Pat. No. 4,265,775 of Nandakumar G. Aakalu and Lawrence A. Rittmiller for NON-BLEEDING THIXOTROPIC THERMALLY CONDUCTIVE MATERIAL, the disclosure of which is hereby incorporated herein by reference. The silicone oil thermal grease described therein is a composition of silicone oil (as polydimethylsiloxane), thermal filler (as dendritic zinc oxide, lemellar boron nitride, and lemellar aluminum oxide), and fumed silica.

Silicone oil thermal greases are difficult to dissolve or strip from a module cap intended to be reused. While the exact reason for this is not well understood, it appears to be due to the high adhesion of the thermal filler particles to the cap, as well as the adhesion of the silicone oil to the cap. Moreover, most solvents and solvent systems appear to selectively remove the silicone oil, leaving behind the metal oxide filler. The filler ultimately creates a barrier for solvent action.

One process for removing silicone oil thermal greases from module caps is described in U.S. Pat. No. 4,514,232 of Joseph G. Ameen, Richard H. Hagrogian, and Samuel L. Smey for PROCESS FOR STRIPPING SILICON OIL BASE THERMAL GREASE. Ameen et al. describe a process for stripping silicone thermal grease from module caps utilizing Dynaloy URESOLVE PLUS TM, an ethylene glycol monomethyl ether based active silicone oil thermal grease. According to the described process a working solution of about 8 to 12 volume percent of Dynaloy URESOLVE PLUS TM ethylene glycol monomethyl ether based active solvent was mixed with about 88 to 92 volume percent methylene chloride, and optionally with about 5 volume percent glacial acetic acid. This process requires the use of chlorinated solvents, as well as toxic substances compounded with the Dynaloy URESOLVE PLUS TM ethylene glycol monomethyl ether based active solvent. Thus, the use of the process of Ameen et al. is not possible in an ozone safe environment.

OBJECTS OF THE INVENTION

It is a principal object of the invention to provide an ozone-safe method of removing silicone oil based thermal grease from module caps.

It is a further object of the invention to remove any zinc oxide formed or deposited on the module caps.

SUMMARY OF THE INVENTION

These and other objects of the invention are attained, and the deficiencies of the prior art overcome by the methods disclosed herein. According to the method of the invention, silicone oil base thermal grease is stripped from a part, as a cap of an integrated circuit chip module by providing a stripping composition containing a major portion of an alkylbenzene, an operative amount of a propylene oxide derived glycol ether based active solvent, and an effective amount of glacial acetic acid.

According to an alternative method of the invention zinc oxide filled adhesives, as uncured, zinc oxide filled, epoxy adhesives are also removed in the stripping composition containing a major portion of an alkylbenzene, an operative amount of a propylene oxide derived glycol ether based active solvent, and an effective amount of glacial acetic acid.

This halogen free, ozone safe solvent wets the part to be stripped while being ultrasonically agitated. Thereafter the part is rinsed in water, and it may be re-contacted with the stripping composition, and with an oxidizing acid, such as nitric acid.

The alkyl benzene solvent base may be a mono-alkyl benzene having the formula $(C_6H_5)R^1$ or a di-alkyl benzene having the formula $(C_6H_4)R^1R^2$ where $R^1$ and $R^2$ are independently chosen from the group consisting of $CH_3$, $C_2H_5$, and $C_3H_5$. Especially preferred is toluene, $(C_6H_5)CH_3$.

Thus, according to the method of the invention it is possible to provide an ozone-safe method of removing silicone oil based thermal grease from module caps, and to also remove any zinc oxide formed or deposited on the module caps.

BRIEF DESCRIPTION OF DRAWINGS

The invention may be understood by reference to the FIGURES appended hereto.

DETAILED DESCRIPTION OF THE INVENTION

Figure 1:
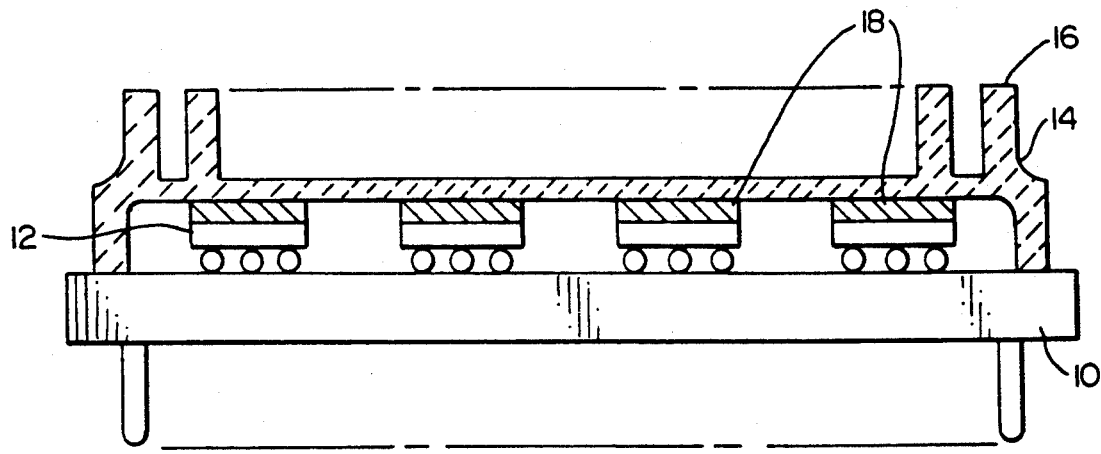
FIG. 1 is a cutaway elevation view of a first level package, with a substrate, a chip, a cap, and thermal grease.

A first level microelectronic package, 1, that is a substrate, 10, an integrated circuit chip, 12, and a cap, 14, is shown in FIG. 1. The integrated circuit chip, 12, or the plurality of integrated circuit chips, are illustrated as joined to the substrate, 10, by "flip chip" bonds. The integrated circuit chips, 12, are thermally joined to the module cap, 14, by pads or deposits, 18, of thermal grease.

According to the method of the invention, silicone oil base thermal grease, 18, is stripped from a part, as a cap, 14, of an integrated circuit chip module, 1, by providing a stripping composition containing a major portion of an alkylbenzene, an operative amount of a propylene oxide derived glycol ether based active solvent, and an effective amount of glacial acetic acid. The stripping composition is halogen free and ozone safe.

Figure 2:
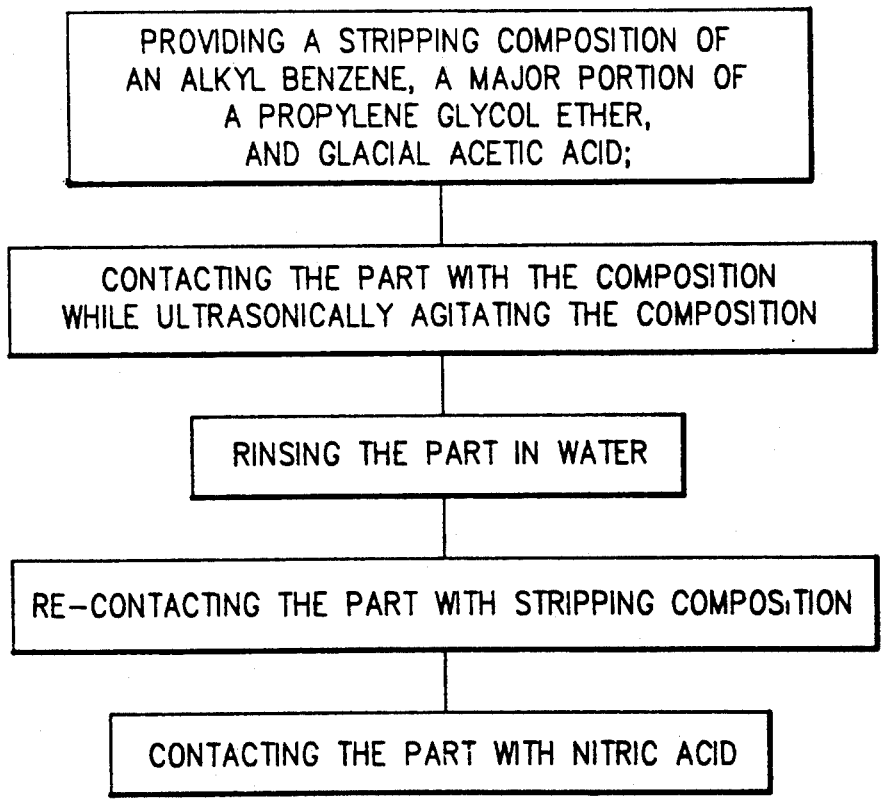
FIG. 2 is a flow chart of the method of the invention.

As shown in the flow chart, FIG. 2, the active solvent solution containing a major portion of an alkylbenzene, an operative amount of a propylene oxide derived glycol ether based active solvent, and an effective amount of glacial acetic acid is brought into contact with the part to be stripped of silicone oil based thermal grease.

This halogen free, ozone safe solvent wets the part to be stripped while being ultrasonically agitated. Thereafter the part is rinsed in water. In an alternative embodiment, shown in FIG. 2, it may be advantageous to re-contact the cap with the stripping composition, and with an oxidizing acid, such as nitric acid. This is in order to remove any particularly adherent zinc oxide or silicone oil.

The alkyl benzene solvent base may be a mono-alkyl benzene having the formula $(C_6H_5)R^1$ or a di-alkyl benzene having the formula $(C_6H_4)R^1R^2$ where $R^1$ and $R^2$ are independently chosen from the group consisting of $CH_3$, $C_3H_5$, and $C_3H_5$. Especially preferred is toluene, $(C_6H_5)CH_3$.

The active solvent is a composition one or more propylene glycol ethers, an alcohol, an alkali metal hydroxide, and, optionally, an organic silicate. Suitable propylene glycol ethers include propylene glycol mono-alkyl ethers, where the alkyl is a methyl group, [—$CH_2$—], or an ethyl group [—$C_2H_4$—], propylene glycol phenyl ethers, and mixtures thereof. Propylene glycol monomethyl ether and mixtures thereof with propylene glycol phenyl ether are preferred. The alcohol is typically methanol or ethanol, with methanol being preferred. The alkali metal hydroxide may be sodium hydroxide or potassium hydroxide, with potassium hydroxide preferred.

A typical active solvent may contain about 40 to 70 weight percent propylene glycol monomethyl ether ether, 15 to 30 weight percent propylene glycol phenyl ether, a small amount, for example 2 to 5 weight percent, methanol, a small amount, for example 2 to 5 weight percent alkali metal hydroxide (as sodium hydroxide or potassium hydroxide, and preferably potassium hydroxide), and traces, for example, less than 1 weight percent of ethyl silicate. One suitable active solvent has been found to be Dynaloy DYNASOLVE 711 TM, a propylene oxide derived propylene glycol monomethyl ether based solvent containing propylene glycol phenyl ether, methanol, potassium hydroxide, and ethyl silicate.

In one exemplification of the invention a stripping composition is prepared containing about 83 to about 87 and preferably about 85 volume percent of an alkylbenzene, as toluene, about 8 to about 12, and preferably about 10 volume percent of an active solvent solution containing a major portion of a propylene oxide derived glycol ether, and from about 4 to about 6, and preferably about 5 volume percent of glacial acetic acid.

The cap is immersed in and contacted with the composition for at least about one minute at room temperature. The contact and immersion is carried out while ultrasonically agitating the composition. The cap may be rinsed in water. The cap may then be subsequently re-immersed in the stripping composition, and even contacted with an oxidizing acid, as 10 to 30 percent aqueous nitric acid.

Thus, according to the method of the invention it is possible to provide an ozone-safe method of removing silicone oil based thermal grease from module caps, and to also remove any zinc oxide formed or deposited on the module caps.

It should be noted that while the invention has been described with respect to filled silicone oil thermal greases, it is also useful in removing filled adhesives, as zinc oxide filled, uncured epoxies.

While the invention has been described with respect to certain preferred embodiments and exemplifications, it is not intended to limit the scope of the invention thereby, but solely by the claims appended hereto.

We claim:

1. A method for stripping a silicone oil base grease from a part, comprising the steps of:
    a. providing a stripping composition comprising:
        i. about 83 to about 87 weight percent of an alkylbenzene,
        ii. about 8 to about 12 weight percent of a solution comprising a major portion of a propylene glycol ether, and
        iii. about 4 to about 6 weight percent of glacial acetic acid;
    b. contacting the part with the composition while ultrasonically agitating the composition;
    c. thereafter rinsing the part in water;
    d. thereafter re-contacting the part with the stripping composition; and
    e. thereafter contacting the part with an oxidizing acid.

2. The method of claim 1 wherein the oxidizing agent is nitric acid.

3. The method of claim 1 wherein the alkyl benzene is chosen from the group consisting of mono-alkyl benzene having the formula $(C_6H_5)R^1$ and dialkyl benzenes having the formula $(C_6H_4)R^1R^2$ where $R^1$ and $R^2$ are independently chosen from the group consisting of $CH_3$, $C_2H_5$, and $C_3H_5$.

4. The method of claim 3 wherein the alkyl benzene is $(C_6H_5)CH_3$.

5. The method of claim 1 wherein the propylene glycol ether is chosen from the group consisting of propylene glycol monomethyl ether, propylene glycol phenyl ether, and mixtures thereof.

6. A process for stripping a silicone oil base grease from a part, comprising the steps of:
    a. providing a stripping composition comprising:
        i. about 83 to about 87 weight percent of toluene,
        ii. about 8 to about 12 weight percent of a solution comprising a major portion of a propylene glycol ether chosen from the group consisting of propylene glycol monomethyl ether, propylene glycol phenyl ether, and mixtures thereof, and
        iii. about 4 to about 6 weight percent of glacial acetic acid;
    b. contacting the part with the composition while ultrasonically agitating the composition;
    c. thereafter rinsing the part in water;
    d. thereafter re-contacting the part with the stripping composition; and
    e. thereafter contacting the part with nitric acid.

7. A process for stripping a filled, uncured epoxy from a part, comprising the steps of:
    a. providing a stripping composition comprising:
        i. about 83 to about 87 weight percent of toluene,
        ii. about 8 to about 12 weight percent of a solution comprising a major portion of a propylene glycol ether chosen from the group consisting of propylene glycol monomethyl ether, propylene glycol phenyl ether, and mixtures thereof, and
        iii. about 4 to about 6 weight percent of glacial acetic acid;
    b. contacting the part with the composition while ultrasonically agitating the composition;
    c. thereafter rinsing the part in water;
    d. thereafter re-contacting the part with the stripping composition; and
    e. thereafter contacting the part with nitric acid.

8. The method of claim 7 wherein the filled, uncured epoxy is a zinc oxide filled, uncured epoxy.

* * * * *